(12) United States Patent
Abraham et al.

(10) Patent No.: US 6,667,897 B1
(45) Date of Patent: Dec. 23, 2003

(54) MAGNETIC TUNNEL JUNCTION CONTAINING A FERRIMAGNETIC LAYER AND ANTI-PARALLEL LAYER

(75) Inventors: David W. Abraham, Croton-on-Hudson, NY (US); Philip L. Trouilloud, Norwood, NJ (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 10/185,659

(22) Filed: Jun. 28, 2002

(51) Int. Cl.[7] .............................. G11C 11/22
(52) U.S. Cl. ........................ 365/145; 365/173
(58) Field of Search .................. 365/145, 157, 365/158, 171, 173; 257/295

(56) References Cited

U.S. PATENT DOCUMENTS

| | | | |
|---|---|---|---|
| 5,524,092 A | * | 6/1996 | Park .......................... 364/145 |
| 5,640,343 A | | 6/1997 | Gallagher et al. |
| 5,650,958 A | | 7/1997 | Gallagher et al. |
| 5,946,228 A | | 8/1999 | Abraham et al. |
| 6,072,718 A | | 6/2000 | Abraham et al. |
| 6,104,633 A | | 8/2000 | Abraham et al. |
| 6,178,073 B1 | | 1/2001 | Hayashi |
| 6,219,275 B1 | * | 4/2001 | Nishimura ............... 365/173 |
| 6,266,218 B1 | | 7/2001 | Carey et al. |
| 6,295,225 B1 | * | 9/2001 | Oepts ..................... 365/171 |
| 6,473,337 B1 | * | 10/2002 | Tran et al. ................ 365/173 |

OTHER PUBLICATIONS

C.C. Williams et al., "Scanning Thermal Profiler," Appl. Phys. Lett. 23, pp. 1587–1589, Dec. 1986.
Mee et al., "Magnetic Recording Handbook," McGraw–Hill, pp. 540–580 (1989).

* cited by examiner

*Primary Examiner*—Tan T. Nguyen
(74) *Attorney, Agent, or Firm*—Daniel P. Morris; Ryan, Mason & Lewis, LLP

(57) ABSTRACT

A magnetic tunnel junction device is provided that includes a free layer and a pinned layer separated by a barrier layer. According to the invention, the free layer includes a ferrimagnetic layer and an anti-parallel layer having a magnetic moment that is substantially anti-parallel to a magnetic moment of the ferrimagnetic layer at least within a predetermined temperature range of the magnetic tunnel junction device. A memory array that includes such a magnetic tunnel junction is also provided.

22 Claims, 3 Drawing Sheets

MAGNETIC TUNNEL JUNCTION CONTAINING A FERRIMAGNETIC LAYER AND ANTI-PARALLEL LAYER

STATEMENT OF GOVERNMENT RIGHTS

This invention was made with Government support under grant contract numbers MDA972-96-C-Z0030 and MDA972-99-C-0009 awarded by the Defense Advanced Research Projects Agency (DARPA) of the United States Department of Defense. The Government has certain rights in this invention.

FIELD OF THE INVENTION

The present invention relates to a memory storage device and, more specifically, to the use of a ferrimagnetic layer and an anti-parallel layer in a free layer of a magnetic tunnel junction (MTJ).

BACKGROUND OF THE INVENTION

Magnetic Random Access Memory (MRAM) technology utilizes storage cells, for example, MTJs, which generally each have at least two magnetic regions or layers with an electrically insulating barrier layer between them. The data storage mechanism relies on the relative orientation of the magnetization of the two layers, and on the ability to discern this orientation through electrodes attached to these layers. For background, reference is made to U.S. Pat. Nos. 5,650,958 and 5,640,343 issued to Gallagher et al. on Jul. 22, 1997 and Jun. 17, 1997, respectively, which are incorporated herein by reference.

An MTJ is a device that typically includes two ferromagnetic electrodes separated by a thin insulating layer. MTJs are based on the phenomenon of spin-polarized electron tunneling. The insulating layer is thin enough that tunneling occurs between the ferromagnetic electrodes.

A conventional MTJ device contains a "free" ferromagnetic layer, e.g. cobalt (Co), and a "pinned" ferromagnetic layer, e.g. cobalt-iron (Co—Fe), separated by the insulating tunneling layer, e.g., aluminum oxide. The "pinned" ferromagnetic layer has a magnetization that is oriented in the plane of the layer but is fixed so as to not be able to rotate in the presence of an applied magnetic field in the range of interest. The pinned ferromagnetic layer is fixed by interfacial exchange coupling with an adjacent antiferromagnetic layer. The "free" ferromagnetic layer has a magnetization that is able to be rotated in the plane of the layer relative to the fixed magnetization of the pinned ferromagnetic layer.

The tunneling phenomenon is electron spin dependent, making the magnetic response of the junction a function of the relative orientations and spin polarizations of the two electrodes. The amount of tunneling current that flows perpendicularly through the two ferromagnetic layers and the intermediate tunnel barrier depends on the relative magnetization directions of the two ferromagnetic layers. If the magnetic axes of the two ferromagnetic layers are aligned with each other, electrical resistance in the MTJ device is lower resulting in a higher level of current through the MTJ device. If the magnetic axes of the ferromagnetic layers are opposite one another, a higher level of resistance will result causing a lower current through the MTJ device. Thus, the magnetic state of the free layer can be read by the measured level of current through the MTJ device.

In operation as a memory device, an MRAM device can be read by measuring the tunneling resistance to infer the state of the magnetization of a free or storage layer with respect to a pinned layer in an MTJ. An MRAM device can be written by reversing the free layer magnetization using external magnetic fields. If the free layer is imagined as a simple elemental magnet which is free to rotate but with a strong energetic preference for aligning parallel or antiparallel to the x axis, and if the pinned layer is a similar elemental magnet but frozen in the +x direction, then there are only two relative magnetization states possible for the free and pinned layers of the device, aligned and anti-aligned.

Various parameters are of interest in evaluating the performance of these devices. First, the variation in resistance between the two storage states is described by the magnetoresistance MR, i.e., the percentage change in resistance between the two states. Historically, ferromagnetic materials with a higher saturation magnetization $M_s$ were used to obtain junctions with higher MR values (see, for example, R. Meservey and P. M. Tedrow, Phys. Rep. 238, 173 (1994)). More recently, it has been shown that there is only a weak link between the magnitude of the saturation magnetization and MR of MTJs containing electrodes formed from alloys of Co, Fe and Ni (D. J. Monsma and S. S. P. Parkin, Appl. Phys. Lett. 77, 720 (2000)).

Second, the coercive field is of interest since fields generated by currents along wires in an array of storage cells will need to be able to rotate the magnetization of the storage layer. As the capacity of memory arrays increases, the MTJ area will inevitably become smaller and more dense. As this happens, the switching field (also termed the coercive field $H_c$) rises roughly inversely with lateral dimension, for the same material and thickness and the same aspect ratio and shape of the device. Using current designs, one quickly reaches a situation where junction size, dictated by needs for higher, density causes the coercive fields to become unmanageably large.

In addition to these issues, there are other problems that arise when trying to push the size of the devices down into the sub-micron regime. First, there are strong demagnetizing fields which will tend to cause the bit to "erase" over time. Second, the demagnetizing field is non-uniform. In particular, the demagnetizing field is strongest close to the edges of the devices. Thus, control over the uniformity of the device is most important at the very spot where there is the most difficulty in fabrication. Small defects at the edge of the magnetic element can therefore lead to nucleation or pinning sites for unwanted micromagnetic structures, resulting in unpredictability of the junction properties. Third, using polycrystalline material such as permalloy can lead to increased variation in device properties because of random orientation of the microcrystallites. In very small devices, the statistical fluctuations due to the grain structure will become much more pronounced. These grains also can cause variations in the tunneling properties between electrodes in the MTJ, causing further uncertainty or variation in device properties.

Several solutions have been proposed in order to alleviate this rising coercivity problem. First, one may reduce the saturation magnetization of the storage electrode, since $H_c$ scales with $M_s$. However, many low $M_s$ materials, for example, formed by alloying Co or Fe with non-magnetic elements, give low MR. Second, one may reduce the thickness of the magnetic electrode, since $H_c$ scales with electrode thickness. Current junctions, however, are on the edge of continuity due to their extremely thin electrodes and further reduction is difficult at best.

Therefore, a need exists for a new approach to fabricating MTJ devices, while still leaving freedom to tune the coercive field and provide an appreciable MR.

SUMMARY OF THE INVENTION

In a first aspect of the invention, an MTJ device is provided. The MTJ device includes a free layer and a pinned layer separated by a barrier layer. The free layer of the MTJ includes a ferrimagnetic material and an anti-parallel layer having a magnetic moment that is substantially anti-parallel to a magnetic moment of the ferrimagnetic layer at least within a predetermined temperature range of the magnetic tunnel junction device. The ferrimagnetic layer and the anti-parallel layer may be separated by a spacer layer, or may be directly adjacent to each other.

In a preferred embodiment, the anti-parallel layer includes a ferromagnetic material. However, the anti-parallel layer can also include a ferrimagnetic material having different magnetic properties than the ferrimagnetic material within the free layer. For example, the ferrimagnetic material used in the anti-parallel layer can have a different compensation temperature than the ferrimagnetic material of the free layer.

In another aspect of the invention, a memory array is provided. The memory array includes a plurality of memory cells, at least one of the memory cells including an MTJ having a free layer that includes a ferrimagnetic material and an anti-parallel layer having a magnetic moment substantially anti-parallel to a magnetic moment of the ferrimagnetic layer at least within a predetermined temperature range of the magnetic tunnel junction device.

DETAILED DESCRIPTION OF INVENTION

Figure 1:
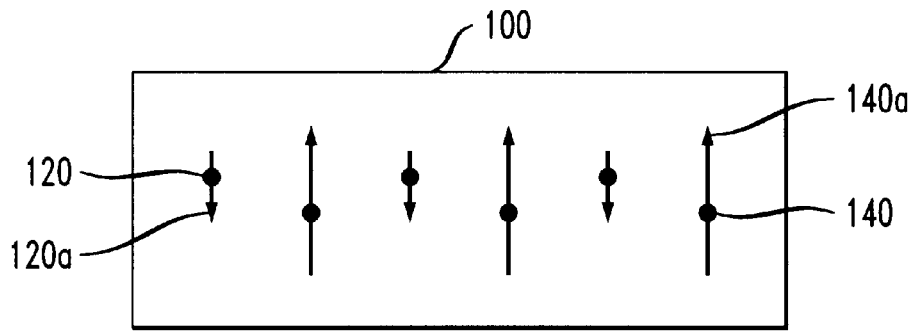
FIG. 1 is a cross-sectional view illustrating an exemplary magnetization orientation of a ferrimagnetic material.

FIG. 1 shows a block 100 of exemplary ferrimagnetic material comprising iron (Fe) atoms 120 and terbium (Tb) atoms 140. It is generally understood that the ferrimagnetic class of materials generally consists of two sublattices, usually a rare earth metal such as terbium and a transition metal such as iron. At low temperatures, i.e. below compensation temperature, the rare-earth moment 140a shown by the long arrows in FIG. 1 is larger than that of the transition metal moment 120a shown by the short arrows in FIG. 1. Thus, there is a net magnetization in the direction of the rare earth moment. However, as temperature rises, the rare-earth moment decreases more rapidly because it is subjected to weaker exchange forces. There is an intermediate temperature, sometimes called compensation temperature ($T_{comp}$), at which the two lattices cancel each other out, and net magnetization of the ferrimagnetic material drops to zero. Both below and above this compensation temperature, there is a finite net magnetization. It is possible to tune the compensation temperature by adjusting the composition of the alloy. Moreover, by judicious choice of the component materials used, one can also adjust the coercive field of the alloy.

Another property of ferrimagnetic materials may be illustrated with respect to magneto-optic (MO) storage. At "rest," i.e. when the material is not being written, the MO media has no net moment. However, the laser used to interrogate the state of the magnetization only interacts strongly with the transition metal sublattice. Hence, even with no net magnetization, two distinct states can be distinguished optically.

The tunneling signal is sensitive to the magnetization state of a preferred one of the sublattices in a manner that is analogous to the MO example described herein above. In addition, the magnetization can be set by adjusting the compensation temperature relative to operating temperature by choice of the constituent materials in the ferrimagnetic layer. This effectively tunes the coercive field to convenient levels for the intended application.

In patent application Ser. No. 09/708,207 entitled "Magnetic Tunnel Junctions Using Ferrimagnetic Materials," filed Nov. 8, 2000 and incorporated herein by reference, the inventors of the instant application disclosed the use of ferrimagnetic materials in an MTJ device. More specifically, in a preferred embodiment of the previously filed application, the inventors disclosed the use of ferrimagnetic materials in the free layer of an MTJ in order to improve selectivity of MRAM memory. When using the ferrimagnetic material in the free layer, it is desirable to hold all elements but the one selected at or near the compensation temperature of the ferrimagnetic layer. This means that the thermal environment of the MRAM device should be carefully controlled or the magnetic properties of the device can change and reduce the window of operability of the device, or render it inoperable. This thermal control can be performed using a built in heat source and temperature regulation circuitry as described in U.S. Pat. No. 6,385,082 entitled "Thermally Assisted MRAM" issued to the same inventors as the instant application on May 7, 2002, and U.S. application Ser. No. 10/128,838 entitled "Memory Storage Device With Heating Element" filed by the same inventors as the instant application on Apr. 23, 2002, both of which are incorporated herein by reference. However, the performance of the MRAM device will suffer in proportion to the temperature drift that occurs in such devices that rely on thermal control methodologies.

The MTJ device provided herein utilizes both a ferrimagnetic layer and an anti-parallel layer in the free layer of the MTJ device. By using an anti-parallel layer in addition to a ferrimagnetic layer as part of the free layer, an MTJ can be arranged to operate away from compensation temperature in a quiescent mode, i.e., when the free layer of the MTJ device is not being switched. As discussed above, an MTJ may be switched when it is being written as part of a memory array device. When the MTJ is selected for writing, it can be heated such that the compensation temperature of the ferrimagnetic layer in the free layer is reached or at least approached. This configuration then allows the selected MTJ to be switched at compensation temperature, instead of away from compensation temperature, thereby avoiding the concern of temperature drift.

Figure 2:
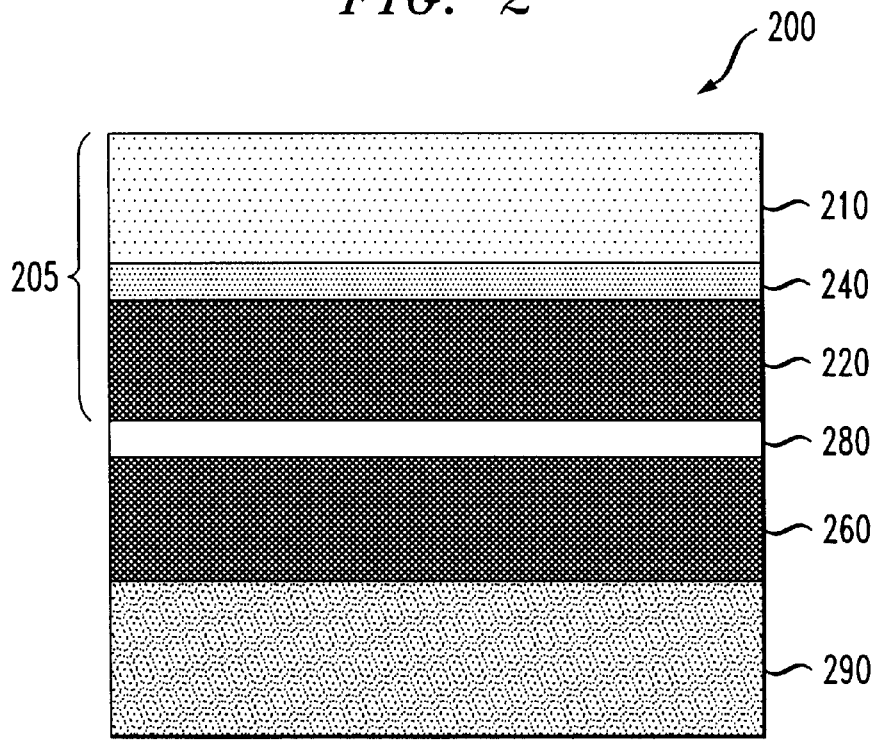
FIG. 2 is a cross-sectional view of an MTJ device in accordance with an embodiment of the present invention.

FIG. 2 shows a schematic view of an MTJ device 200 according to an embodiment of the invention. The device 200 includes a free layer 205 and a pinned layer 260, which are separated by a barrier layer 280. According to the invention, the free layer 205 includes a ferrimagnetic layer 210 and an anti-parallel layer 220.

In one illustrative embodiment, the free layer 205 also includes a spacer layer 240 that separates the ferrimagnetic layer 210 and the anti-parallel layer 220. Thus, the free layer 205 according to the invention can form a sandwich layer composite as depicted in FIG. 2.

Alternatively, the free layer 205 may lack a spacer layer such that the ferrimagnetic layer 210 and anti-parallel layer 220 are directly adjacent to each other. In this embodiment, the ferrimagnetic layer 210 and anti-parallel layer 220 could be exchange-coupled directly together. Although not bound by theory, it is believed that the anti-parallel layer 220, e.g., the ferromagnetic material in the anti-parallel layer 220, can be exchange-coupled to one of the two constituent sublattices of the ferrimagnetic layer 210. Then, at temperatures below the compensation temperature, the magnetization of the ferrimagnetic layer 210 and anti-parallel layer 220 would yield no net moment in the free layer 205. At temperatures above compensation temperature, the moments of the two layers could add, providing even greater discrimination between selected and unselected MTJs.

The ferrimagnetic layer 210 includes a first ferrimagnetic material as is known in the art. Examples of such ferrimagnetic materials are alloys that include at least one of gadolinium (Gd), Tb, and dysprosium (Dy) and further include at least one of Fe and Co.

The anti-parallel layer 220 preferably includes a ferromagnetic material. Ferromagnetic materials are well known in the art. Alternatively, the anti-parallel layer 220 can include a second ferrimagnetic material that has different properties than the first ferrimagnetic material included in ferrimagnetic layer 210. For example, the thickness and compensation temperature of the anti-parallel 220 layer can be chosen so that a balance between the magnetic moment of the first magnetic material in the ferrimagnetic layer 210 and second ferrimagnetic material in the anti-parallel layer 220 occurs in the free layer 205 at the operating temperature of an MRAM device. In addition, a relatively abrupt change in the magnetic moment of the free layer 210 can be created with a change in temperature of the free layer 210 of the selected MTJ as the compensation temperature of either the first ferrimagnetic material in the ferrimagnetic layer or the second ferrimagnetic material in the anti-parallel layer is approached.

The anti-parallel layer 220 has been labeled as such because the magnetic moment of the anti-parallel layer 220 is substantially anti-parallel to a magnetic moment of the ferrimagnetic layer 210 when the MTJ is at rest temperature, i.e. when the MTJ has not been selected for a write (i.e., to have the magnetization of its free layer switched). Substantially anti-parallel, as used herein, means that the magnetic moments of the anti-parallel layer 220 and ferrimagnetic layer 210 are substantially 180 degree apart. This anti-parallel configuration allows the magnetic moments of the ferrimagnetic layer 210 and the anti-parallel layer 220 to cancel each other out at the operating temperature of, for example, an MRAM device. An imbalance caused by a temperature change will create a net moment of the free layer 205.

The spacer layer 240, if employed, separating the first ferrimagnetic layer 210 and the anti-parallel layer 220, preferably includes a non-magnetic conducting material. Preferably, the material used in the spacer layer is a material having high heat conductivity, such as a metal. The spacer layer 240 can be chosen to have direct anti-parallel exchange coupling, or can provide a magnetic separation so that an anti-parallel configuration is favored due to dipole coupling between the ferrimagnetic layer 210 and the anti-parallel layer 220.

The pinned layer 260 can be conventional and is preferably comprised of permalloy or other ferromagnetic material as is known in the art. The MTJ device may further include a fixing layer 290. Fixing layer 290 is a layer that substantially fixes the magnetization orientation of pinned layer 260. For example, when the pinned layer 260 is comprised of a ferromagnetic material, fixing layer 290 is preferably an antiferromagnetic material. The barrier layer 280 preferably includes an electrically insulating material as is known in the art, such as aluminum oxide.

The MTJ of the invention is not limited to any particular configuration of the various layers described above. For example, in the preferred configuration of the free layer 205 shown in FIG. 2, the ferrimagnetic layer 210 is located above the spacer layer 240 and the anti-parallel layer 220 is located below the spacer layer 240, adjacent to the barrier layer 280. As mentioned above, the anti-parallel layer 220 is preferably a ferromagnetic layer. Locating the anti-parallel layer 220 containing ferromagnetic material adjacent to the barrier layer 280 and closest to the pinned ferromagnetic layer 260 can have the effect of allowing tunneling to occur between two ferromagnetic layers, as is conventionally done in an MTJ device. The significant body of work on MRAM tunnel junctions can then be used in depositing the layers that comprise the MTJ. Another exemplary configuration of the MTJ device is to locate the ferrimagnetic layer 210 adjacent to the barrier layer 280 and the anti-parallel layer 220 above the spacer layer 240. Other configurations of the MTJ device are also contemplated by the present invention.

According to one embodiment, the net magnetization of free layer 205 and the magnetization of the pinned layer 260 may each be oriented in a plane that is parallel to the layers 205 and 260. Alternatively, the magnetizations of layers 205 and 260 may each be oriented in a plane perpendicular to layers 205 and 260. According to another embodiment, layers 205 and 260 may be magnetized at an angle to each other, preferably perpendicular.

Figure 3A:
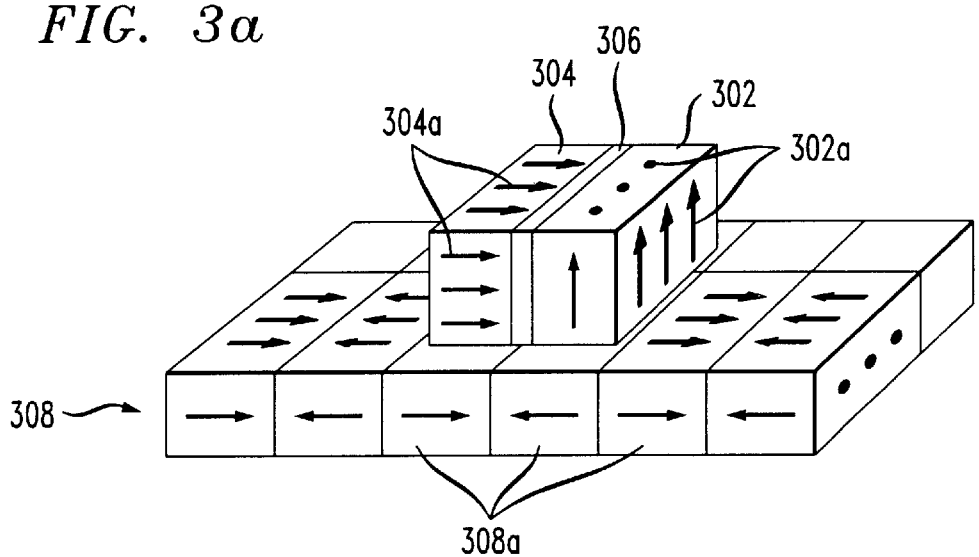
FIG. 3a is a cross-sectional view showing magnetization orientation of an MTJ device in accordance with an embodiment of the present invention.
Figure 3B:
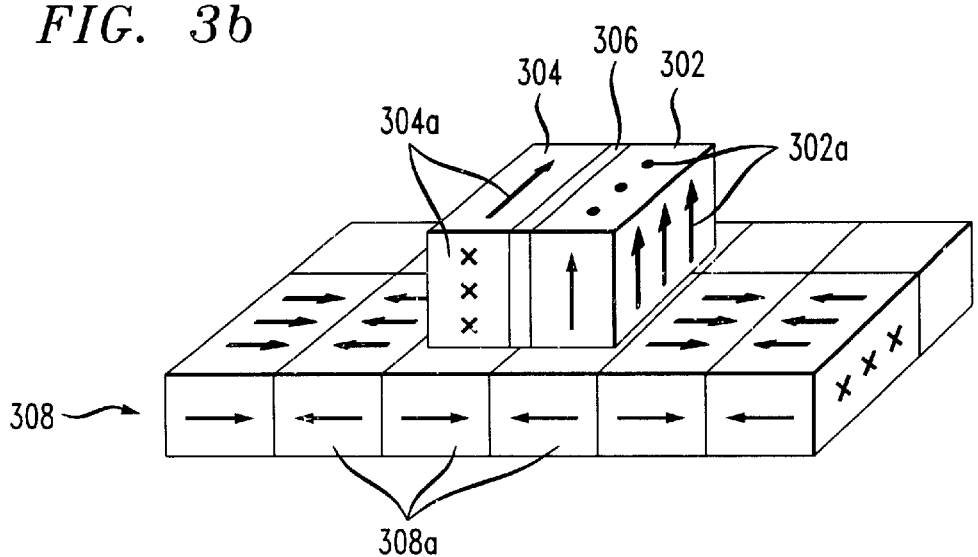
FIG. 3b is a cross-sectional view showing an alternative magnetization orientation of an MTJ device in accordance with an embodiment of the present invention.

FIGS. 3a and 3b illustrate orientations of the magnetization of the free and pinned layers according to an embodiment of the invention. Free layer 302 and pinned layer 304 are shown separated by a tunnel barrier layer 306, e.g. aluminum oxide. The free layer 302 is characterized by a magnetization oriented as illustrated by arrows 302a. Pinned layer 304 is a magnetic material, e.g. ferromagnetic or ferrimagnetic, which has its magnetization oriented, as illustrated by arrows 304a, at an angle to the magnetization illustrated by arrows 302a. As shown in FIGS. 3a and 3b, that angle is preferably about 90 degrees. As will be understood, the MTJ device of FIGS. 3a and 3b should have a non-zero angle between arrows 302a and 304a to permit sensing of bits 308a in magnetization of a nearby medium 308.

Figure 4:
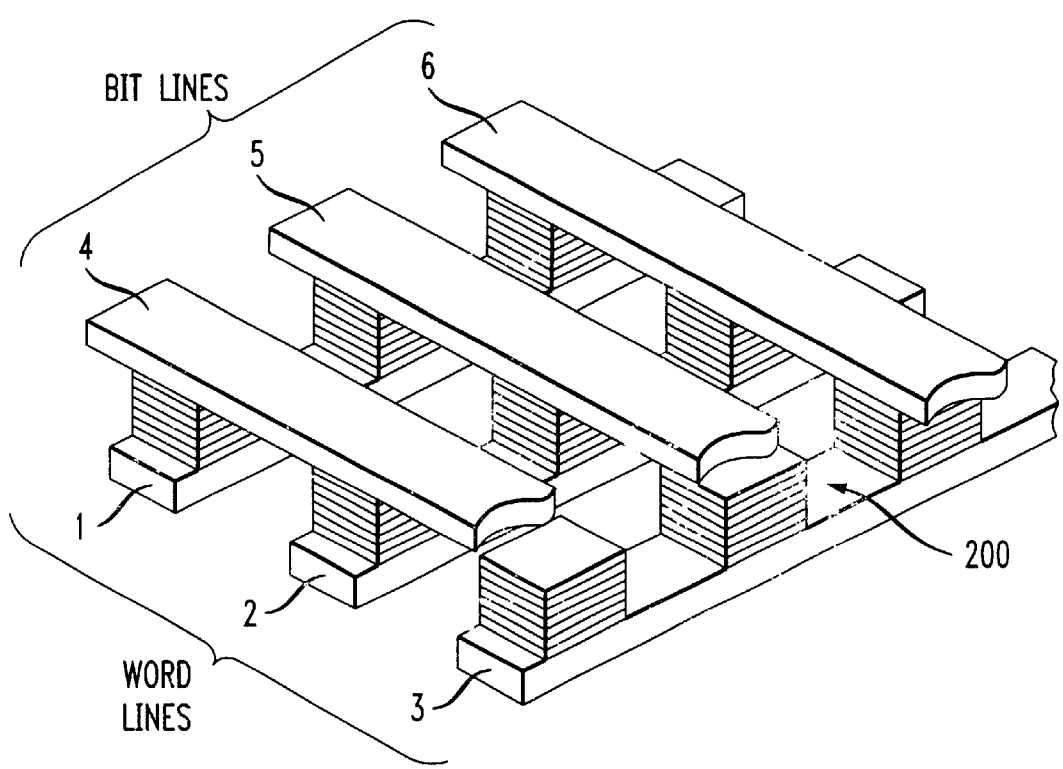
FIG. 4 illustrates at least a portion of a magnetic memory array, including a plurality of MTJ devices formed in accordance with an embodiment of the present invention.

A memory array, such as an MRAM array, is also provided herein. FIG. 4 shows a memory array according to an embodiment of the invention. The memory array includes a plurality of memory cells, which preferably include an MTJ device 200, formed in a manner consistent with that shown in FIG. 2. As apparent from FIG. 4, the MTJs are preferably positioned at the intersecting regions of word lines 1, 2, 3 and bit lines 4, 5, 6, vertically spaced between the lines. Although three word lines and three bit lines are illustrated in FIG. 4, the number of lines in the memory array would typically be much larger. The bit lines are preferably oriented in a different direction, e.g., at right angles to the word lines, so that the two sets of lines form intersecting regions when viewed from above. According to a preferred embodiment of the present invention, write selectivity of an MTJ within the memory array or group of MTJs within the array may be selectively increased by heating only the selected MTJ(s), thereby reducing the likelihood of unintentionally writing adjacent cells, and improving the quality of the switching characteristics of the selected MTJ(s).

By using a free layer 205 having a ferrimagnetic layer 210 and an anti-parallel layer 220 as shown in FIG. 2, it is possible to have the static elements of a memory array device, such as an MRAM device, at a temperature below the compensation temperature and still be insensitive to external magnetic fields. The magnetization and thickness of the layers of the free layer 205 can be chosen such that at the operating temperature of an MRAM device, chosen to, be sufficiently below the compensation temperature so that the ferrimagnetic moment is weakly temperature dependent, the net moment of the composite free layer 210 is low or zero.

During selection, the free layer composite of a selected MTJ device can be heated, for example, by current passing through the MTJ device. The magnetic moment of the ferrimagnetic material within the ferrimagnetic layer 210 can be driven to or near zero, so that the net moment of the ferrimagnetic layer 210 and anti-parallel layer 220 (preferably ferromagnetic) within the free layer 210 rises sharply. In this condition, the selected MTJ within the memory array is switchable at a much-reduced magnetic field. Thus, selecting the MTJ by heating the device to or near its compensation temperature can significantly lower the switching field of the device by causing an imbalance in the magnetic moment of the ferrimagnetic layer 210 and the anti-parallel layer 220 within the free layer 205 of the MTJ device. This reduction in field required to switch the state of the device (or write in the case of a memory device) substantially improves the ability to accurately write a desired state in the MTJ, while simultaneously allowing other non-selected (i.e., non-heated) MTJs within the memory array to resist any unintended change of state.

With this configuration, selection can be enhanced by increasing the ratio of switching fields with and without selection by heating current, determined by the degree of cancellation of the moment in the free layer. This degree of cancellation is relatively insensitive to operating temperature, since the ferrimagnetic moment is much less temperature sensitive at operating point than if the memory storage device were to be operated at or near compensation. Further, maximum selectivity can be achieved if the temperature of the device passes through the compensation temperature during the time in which the writing magnetic field is applied. Hence, the invention provides a greater range of operating temperature of the memory array than is provided by conventional MTJ devices.

While the present invention has been described with reference to preferred embodiments thereof, numerous obvious changes and variations may readily be made by persons skilled in the field of magnetic materials and devices. Accordingly, the invention should be understood to include all such variations to the full extend embraced by the claims.

What is claimed is:

1. A magnetic tunnel junction device comprising a free layer and a pinned layer, said free layer being separated from said pinned layer by a barrier layer, wherein said free layer comprises:
   a ferrimagnetic layer comprising a ferrimagnetic material; and
   an anti-parallel layer proximate to the ferrimagnetic layer, the anti-parallel layer having a magnetic moment that is substantially anti-parallel to a magnetic moment of the ferrimagnetic layer at least within a predetermined temperature range of the magnetic tunnel junction device.

2. The magnetic tunnel junction device of claim 1, wherein said ferrimagnetic layer and said anti-parallel layer are separated by a spacer layer.

3. The magnetic tunnel junction device of claim 1, wherein said ferrimagnetic layer and said anti-parallel layer are directly adjacent to each other.

4. The magnetic tunnel junction device of claim 1, wherein said anti-parallel layer comprises a ferromagnetic material.

5. The magnetic tunnel junction device of claim 1, wherein said anti-parallel layer comprises a ferrimagnetic material having a compensation temperature that is different than a compensation temperature of the ferrimagnetic material in the ferrimagnetic layer.

6. The magnetic tunnel junction device of claim 1, wherein the anti-parallel layer is adjacent to said barrier layer.

7. The magnetic tunnel junction device of claim 1, wherein the ferrimagnetic layer is adjacent to said barrier layer.

8. The magnetic tunnel junction device of claim 1, wherein said pinned layer comprises a ferromagnetic material.

9. The magnetic tunnel junction device of claim 8, wherein said device further comprises an anti-ferromagnetic coupled to said pinned layer.

10. The magnetic tunnel junction device of claim 1, wherein said ferrimagnetic layer has a magnetization state that is responsive to a change in temperature thereof.

11. A memory array comprising a plurality of memory cells, at least one of said memory cells comprising a magnetic tunnel junction device including a free layer and a pinned layer separated by a barrier layer, wherein said free layer comprises:
   a ferrimagnetic layer comprising a ferrimagnetic material; and
   an anti-parallel layer proximate to the ferrimagnetic layer, the anti-parallel layer having a magnetic moment that is substantially anti-parallel to a magnetic moment of the ferrimagnetic layer at least within a predetermined temperature range of the magnetic tunnel junction device.

12. The memory array of claim 11, wherein said ferrimagnetic layer and said anti-parallel layer are separated by a spacer layer.

13. The memory array of claim 11, wherein said ferrimagnetic layer and said anti-parallel layer are directly adjacent to each other.

14. The memory array of claim 11, wherein said anti-parallel layer comprises a ferromagnetic material.

15. The memory array of claim 11, wherein said anti-parallel layer comprises a ferrimagnetic material having a compensation temperature that is different than a compensation temperature of the ferrimagnetic material in the ferrimagnetic layer.

16. The memory array of claim 11, wherein the anti-parallel layer within said free layer is adjacent to said barrier layer.

17. The memory array of claim 11, wherein the ferrimagnetic layer within said free layer is adjacent to said barrier layer.

18. The memory array of claim 11, wherein said pinned layer comprises a ferromagnetic material.

19. The memory array of claim 18, wherein said device further comprises an anti-ferromagnetic layer coupled to said pinned layer.

20. The memory array of claim 11, wherein said ferrimagnetic layer has a magnetization state that is responsive to a change in temperature thereof.

21. The memory array of claim 11, wherein said array has an operating temperature that is below a compensation temperature of the ferrimagnetic layer.

22. The memory array of claim 11, wherein said array is a magnetic random access memory device.

* * * * *